United States Patent
Mores et al.

[11] Patent Number: 6,111,443
[45] Date of Patent: Aug. 29, 2000

[54] ACCELERATED SWITCHING BY SELECTION OF VARIOUS THRESHOLD LEVELS

[75] Inventors: Robert Mores, Hamburg; Harald Eisele, Pinneberg, both of Germany

[73] Assignee: U.S. Philips Corporation, New York, N.Y.

[21] Appl. No.: 09/010,895

[22] Filed: Jan. 22, 1998

[30] Foreign Application Priority Data

Jan. 23, 1997 [DE] Germany .................... 197 02 303

[51] Int. Cl.[7] .................... H03K 3/356; H03K 17/04
[52] U.S. Cl. .................... 327/206; 327/74; 327/166; 327/374
[58] Field of Search .................... 327/74, 75, 76, 327/166, 205, 206, 374, 379, 387

[56] References Cited

U.S. PATENT DOCUMENTS

| | | | |
|---|---|---|---|
| 4,479,266 | 10/1984 | Eumurian et al. | 327/72 |
| 4,549,220 | 10/1985 | Suzuki | 358/283 |
| 4,585,952 | 4/1986 | Yamamoto | 327/166 |
| 4,639,681 | 1/1987 | Hasegawa | 327/166 |
| 4,700,357 | 10/1987 | Ast | 375/4 |
| 5,003,196 | 3/1991 | Kawaguchi | 327/62 |
| 5,373,400 | 12/1994 | Kovacs | 327/62 |
| 5,418,409 | 5/1995 | Kuhn | 327/78 |
| 5,539,340 | 7/1996 | Van Leeuwen et al. | 327/74 |
| 5,673,282 | 9/1997 | Wurst | 372/38 |

FOREIGN PATENT DOCUMENTS

0455910A2  11/1991   European Pat. Off.  ........ H04L 25/30

OTHER PUBLICATIONS

"Halbleiter–Schaltungstechnik", Springe–Verlag. 1978. pp. 134, 135, 412–415.

Primary Examiner—Timothy P. Callahan
Assistant Examiner—Terry L. Englund
Attorney, Agent, or Firm—Steven R. Biren

[57] ABSTRACT

Generally speaking, steep signal edges are required for the processing of digital signals; however, notably externally supplied signals which are conducted, for example, via long cables are liable to have comparatively flat signal edges. By selecting appropriate switching thresholds, delays between an input signal and an output signal of a circuit can be minimized. The circuit selects the first switching threshold at a low value of the input signal and switches the first threshold value to a second, higher threshold value when the input signal exceeds a further, higher threshold value. Thus, an output signal is generated comparatively quickly after the beginning of the positive-going or negative-going edge of the input signal. This can be realized by switching over the switching threshold of a comparator or by utilizing two comparators. Switching over to the various switching thresholds, or the various comparators, is provided by a further control circuit which may also be driven by the comparators themselves. A particularly high insensitivity to interference is achieved when use is made of two comparators which themselves are constructed as Schmitt triggers.

14 Claims, 5 Drawing Sheets

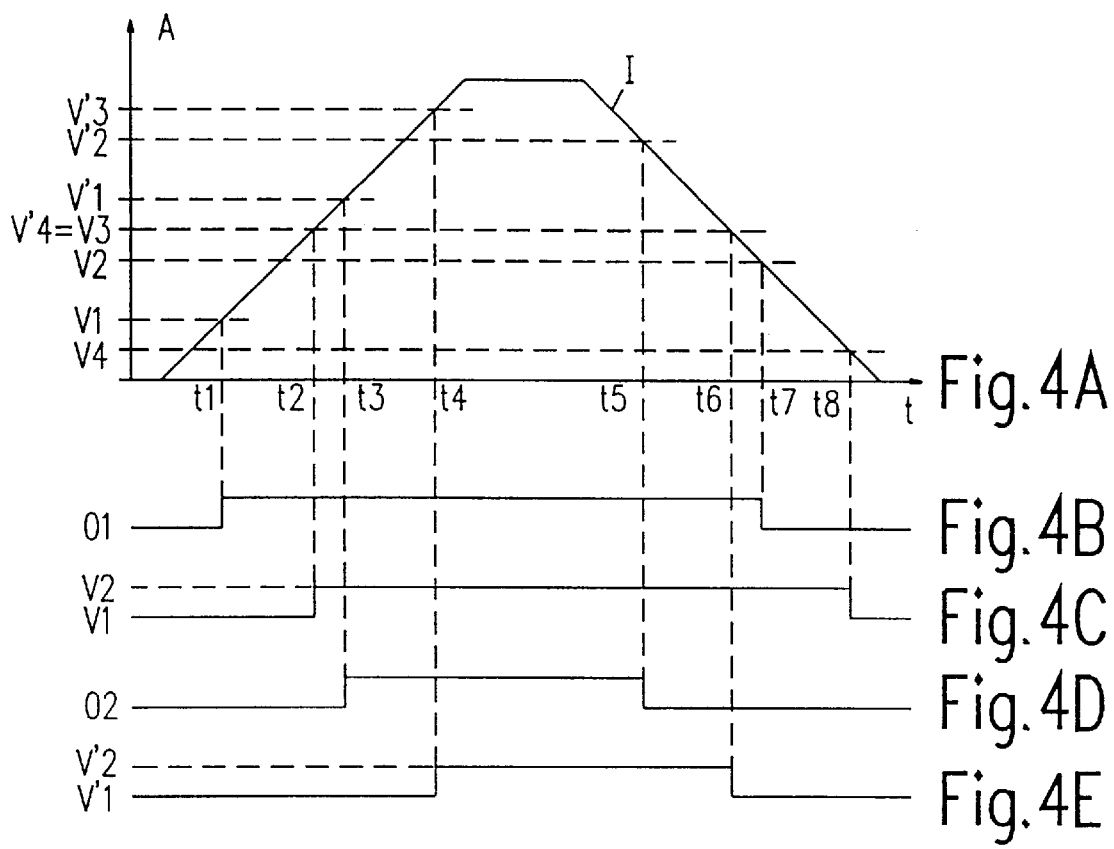

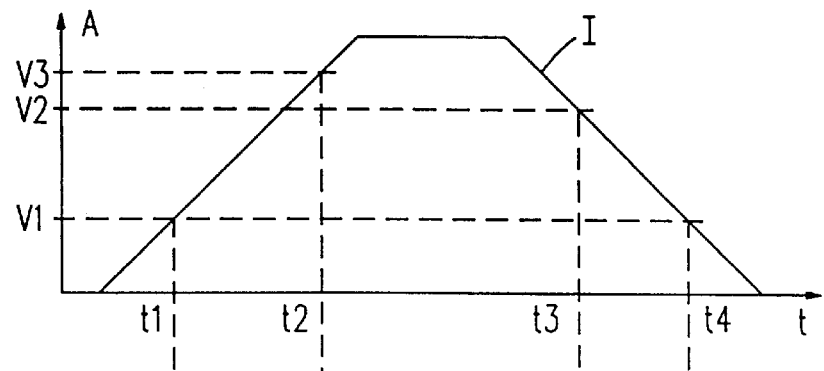
Fig.8A
Fig.8B
Fig.8C
Fig.8D
Fig.8E
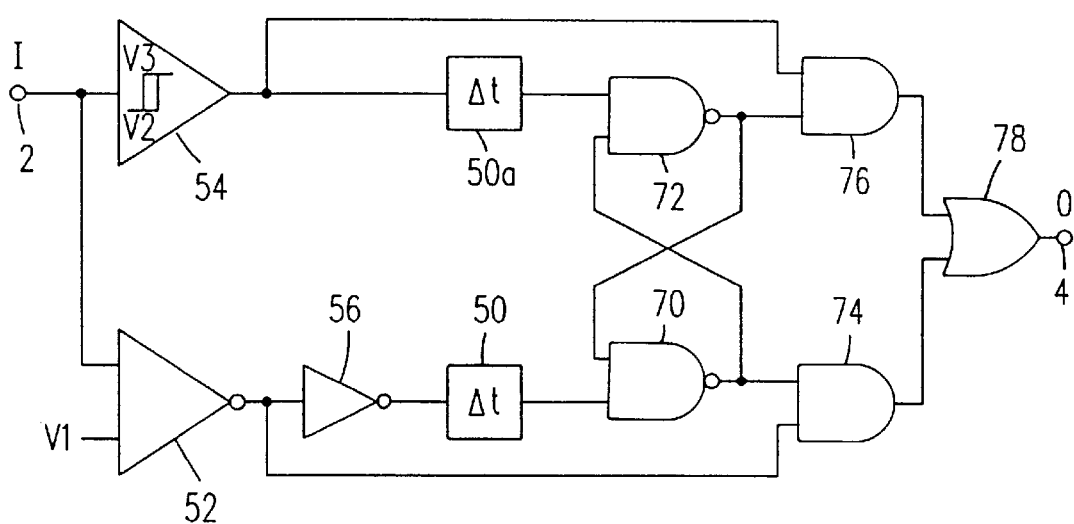
Fig.9

ACCELERATED SWITCHING BY SELECTION OF VARIOUS THRESHOLD LEVELS

BACKGROUND OF THE INVENTION

The invention relates to a circuit arrangement for generating an output signal, having a plurality of predetermined values which change quickly from an input signal which varies substantially more slowly.

Circuit arrangements of this kind are generally known, for example from the book by Tietze/Schenk "Halbleiter-Schaltungstechnik", Springer-Verlag 1978, pp. 134 and 135 as well as pp. 412 to 415, and serve to generate particularly unambiguous binary signals, having two signal values, from an input signal with slow signal transitions, said binary signals being suitable for further processing in logic circuits. The value of the output signal of such a circuit changes when the input signal exceeds a high threshold value, and the output signal returns to its previous value when the input signal subsequently drops below a lower threshold value. It is thus ensured that the output signal will not be influenced by any small interference signals superposed on the input signal. This is achieved because when the input signal has exceeded the upper threshold value, only a negative interference signal which drops the input signal below the lower threshold value can cause a change of the output signal, and vice versa upon the trailing edge of the input signal.

It is a drawback of the known circuits that the evaluation of the signal can take place only comparatively late after the beginning of the positive-going or negative-going edge. When the input signals originate from a bus whereto several apparatus are connected, each apparatus being capable of initiating the transmission of a message (multi-master operation), in order to avoid conflicts on the bus each signal is sampled a predetermined period of time after the beginning of the leading edge of the signal and only the signal state upon sampling is evaluated. In the case of an extensive bus, the signal edges could be comparatively flat so that the duration of each signal may not be shorter than a given value. Consequently, the maximum frequency of the signals, and hence the transmission capacity of the bus, is limited. Moreover, in the known circuits the input signal must exceed the upper threshold value as well as drop below the lower threshold value. However, if the input signal is derived from the signal difference on two leads transmitting a signal in phase opposition and, for example one of these two leads constantly transmits a high or a low signal because of a fault, the input signal derived therefrom will change with a smaller swing only in the lower or the upper value range, so that in such a case it is difficult to obtain a useful output signal by means of the known circuit arrangements.

SUMMARY OF THE INVENTION

It is an object of the invention to provide a circuit arrangement of the kind set forth which enables as fast as possible evaluation of an input signal variation and which operates quite reliably even in the event of input signals with a smaller swing and an offset of the order of magnitude of this smaller signal swing.

This object is achieved according to the invention in that the threshold value at which the value of the output signal changes is low at the positive-going edge of the input signal and high at the negative-going edge of the input signal. Switching over between these two threshold values takes place in dependence on the input signal, that is at further threshold values which may differ from the former threshold values. Switching over to the higher threshold value takes place when the positive-going edge of the input signal has at least exceeded said higher threshold value, and switching back to the lower threshold value takes place when the signal drops at least below this lower threshold value at the negative-going edge of the input signal. The transition of the output signal can then take place earlier than in known circuits, i.e. briefly after the beginning of the positive-going edge or the negative-going edge. However, it is an inevitable consequence of this step that the signal-to-noise ratio is reduced at least for given interference signals. This is compensated by the fact that the input signal is sampled in known manner a given period of time after the first transition of the output signal.

The principle of the invention can also be used in case the output signal is not a binary signal, but a signal that can assume more than two values. A correspondingly larger number of threshold values is then required. Switching over of the switching threshold from the lower or first threshold value to the upper or second threshold value can take place when the input signal exceeds a third threshold value which may be larger than or equal to the second threshold value, and the switching threshold can be switched over to the first threshold value when the input signal drops below a fourth threshold value which is equal to or lower than the first threshold value. When the threshold values are equal, a higher insensitivity against interference signals can be achieved if the switching over is delayed after the corresponding threshold value has been reached.

A practical implementation of the circuit arrangement according to the invention utilizes a comparator in order to generate the output signal, which comparator compares the input signal with a threshold value and changes the value of the output signal in the case of correspondence, the threshold value being switched over by an additional switching device in dependence on the input signal. If the comparator has a switching hysteresis for the relevant threshold value, the sensitivity to interference signals in the input signal is reduced.

A further embodiment of the circuit arrangement according to the invention utilizes two comparators, one of which compares the input signal with the first threshold value whereas the other comparator compares the input signal with the second threshold value. The outputs of the two comparators are applied to a switch which is switched over in dependence on the third and the fourth threshold value, and hence derives the output signal from the output of one or the other comparator. The operation is then exactly the same as for the switching over of the threshold value when only one comparator is used for the first and the second threshold value. At least one or both comparators may again exhibit switching hysteresis so as to reduce the sensitivity to interference signals in the input signal.

The switching over of the threshold value in the case of use of one comparator, or of the output signal in the case of use of two comparators, is performed by means of a switching device which is controlled by the input signal. This device may include a threshold value switch with hysteresis, the switching points being the same as the third and the fourth threshold value, respectively. However, a respective comparator may also be used for each of these two threshold values, the two comparators then controlling a storage stage whose output signal provides the switching over. For the latter embodiment and the use of two comparators for generating the output signal, moreover, the signals on the outputs of these comparators can be used directly for controlling the storage stage. This results in a particularly simple construction.

BRIEF DESCRIPTION OF THE DRAWINGS

Embodiments of the invention will be described in detail hereinafter with reference to the drawing. Therein:

FIGS. 4A–4E show examples of signal waveforms at different points of the circuit arrangement of FIG. 3, FIGS. 8A–8E show examples of signal waveforms at individual points of the circuit shown in FIG. 7, and FIG. 9 shows a circuit arrangement in which the switches are implemented by means of gates.

DESCRIPTION OF THE PREFERRED EMBODIMENTS

Figure 1:
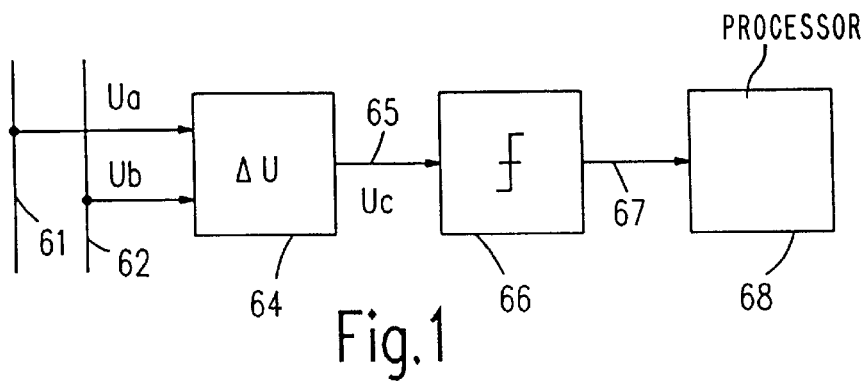
FIG. 1 shows diagrammatically a device for the evaluation of differential signals with the circuit arrangement according to the invention.
Figure 2A:
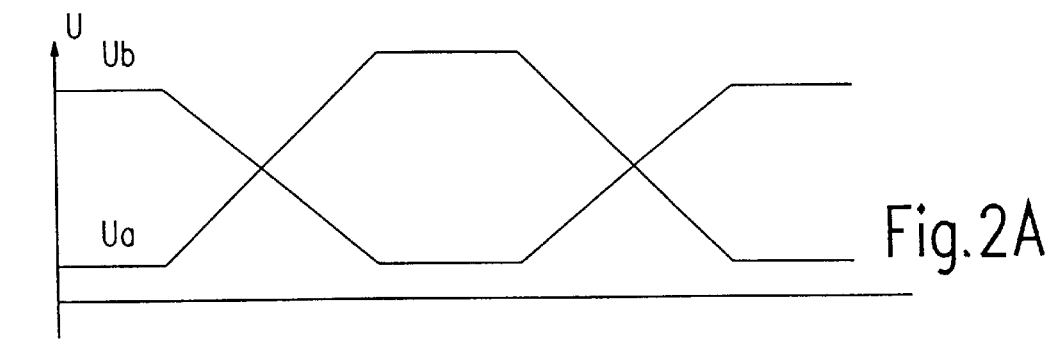
FIGS. 2A–2C show examples of signal waveforms at points of the circuit arrangement of FIG. 1 in the no-fault case and in the case of one faulty lead.

In the block diagram shown in FIG. 1 signals are transmitted in phase opposition on two leads 61 and 62 as represented by the waveforms for the signal voltages Ua and Ub in FIG. 2a. These two signal voltages are applied to a stage 64 which forms the difference Ua–Ub between the two signal voltages, said difference being output as the signal voltage Uc on the lead 65. The lead 65 is connected to a block 66 which contains the circuit arrangement according to the invention and generates output signals having steep edges on the lead 67. These signals are applied to a processing device 68 which will not be described herein since it does not form part of the invention.

Figure 2B:
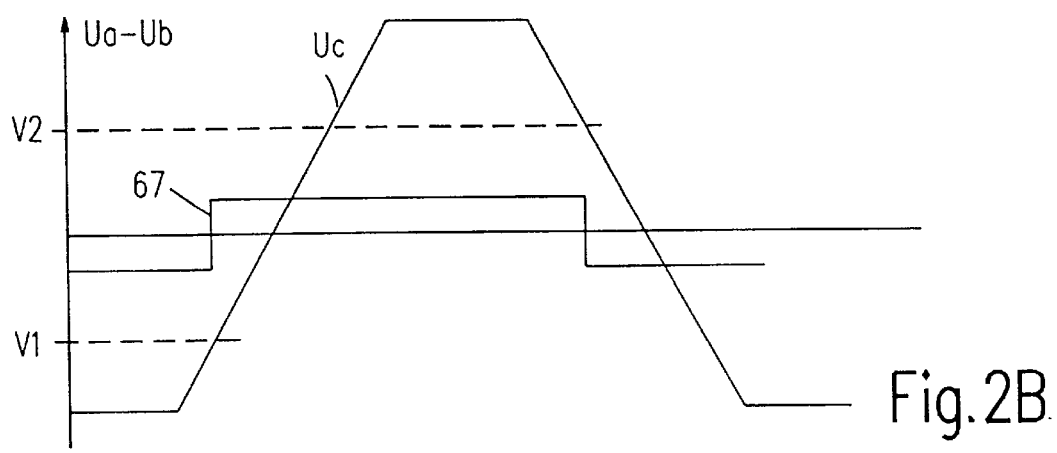

FIG. 2b shows the variation of the signal voltage Uc=Ua–Ub and the voltage on the lead 67. The voltage Uc, forming the input signal for the block 66, in this case varies from negative to positive values, but it will be evident that it is also possible to generate exclusively positive values for the signal voltage Uc by applying an appropriate voltage shift.

The circuit arrangement according to the invention, being included in the block 66, is constructed so that the value of the signal on the lead 67 changes already when the signal voltage Uc exceeds a lower threshold value V1. When the signal voltage Uc exceeds an upper threshold value V2 or an even higher threshold value, the switching threshold of the circuit arrangement in the block 66 is switched over to the threshold value V2 with the result that the value of the signal on the lead 67 changes at the negative-going edge of the signal voltage Uc when it drops below the second threshold value V2. Thus, in both cases an output signal is generated soon after the beginning of a transition of the signal voltage Uc, thus enabling faster or earlier evaluation of the signal transitions on the leads 61 and 62.

Figure 2C:
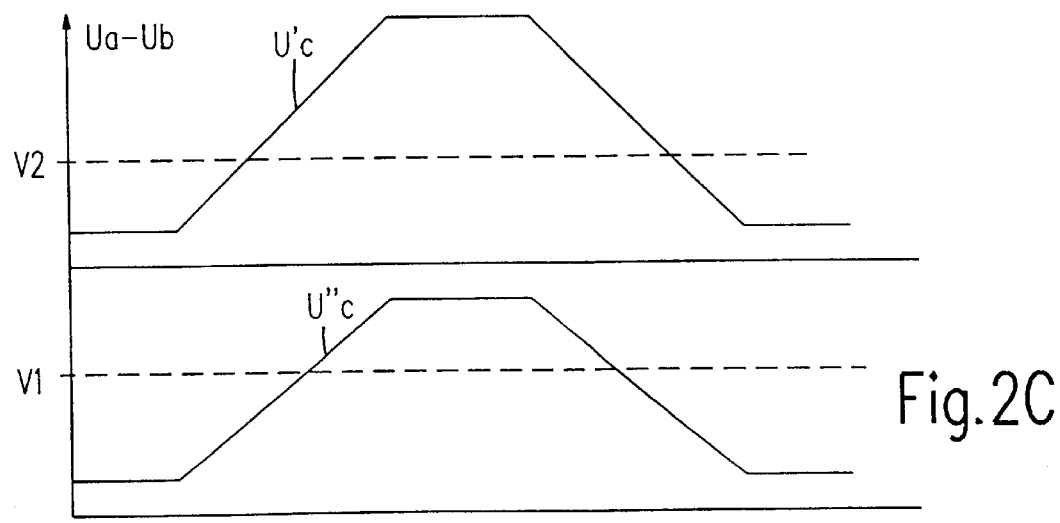

FIG. 2c shows the variation of the signal voltage Uc when the lead 61 or the lead 62 is faulty, for example because the relevant lead is short-circuited to ground or to the supply voltage. For the signal variation U'c it is assumed that the voltage Ua continuously has a high potential or the voltage Ub continuously has reference potential. Accordingly, for the variation of the signal voltage U"c it is assumed that the voltage Ub continuously has high potential or that the voltage Ua continuously has reference potential. It can be seen that the voltage U'c never passes the lower threshold value V1, so that the upper threshold value V2 remains continuously active. Accordingly, the signal voltage U"c never passes the upper threshold value V2, so that in this case the lower threshold value V1 always remains active. The circuit according to the invention thus generates an output signal in both cases.

Figure 3:
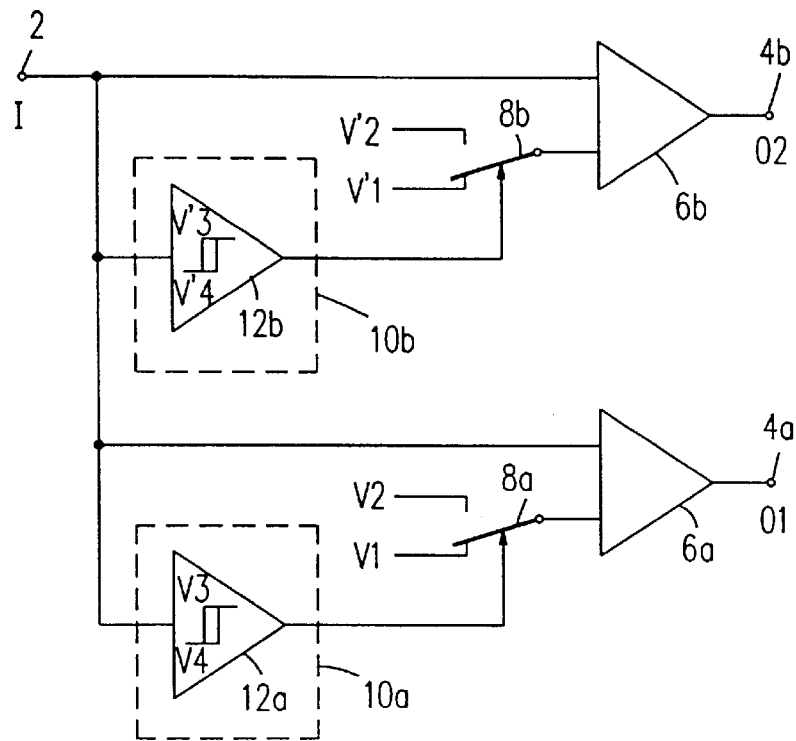
FIG. 3 shows an embodiment of the circuit arrangement according to the invention for more than two different values of the output signal.

FIG. 3 shows an embodiment of the circuit arrangement which is represented by the block 66 in FIG. 1. In the present example the circuit arrangement serves to generate three different values of the output signal which is output via two separate outputs 4a and 4b for a respective binary signal. A signal input 2 for an input signal I is connected to a first input of two comparators 6a and 6b which have a second input which is connected to a switch 8a, 8b, respectively. The binary state of the output signal of the comparators 6a and 6b, output via the outputs 4a and 4b, respectively, changes when the signal voltage on the first input of the relevant comparator becomes larger or smaller, respectively, than the voltage on the second input. The second input of the comparators 6a and 6b receives a first threshold value V1, V'1 or a second threshold value V2, V'2, respectively, depending on the position of the switch 8a or 8b.

The position of the switches 8a and 8b is controlled by a switching device 10a, 10b, respectively, having an input which is also connected to the signal input 2. The switching device 10a, controlling the switch 8a, includes a Schmitt trigger 12a whose output signal changes over from a first value to a second value when an upper switching threshold V3 is exceeded and whose input signal assumes the first value again when the output signal subsequently drops below a lower switching threshold V4. Similarly, the switching device 10b includes a Schmitt trigger 12b whose output signal changes its value when the input signal exceeds an upper switching threshold V'3 or when the input signal drops below a lower switching threshold V'4.

The function of the circuit arrangement shown in FIG. 3 will be described in detail with reference to the diagram of FIG. 4. FIG. 4a shows an input signal having a linearly ascending and descending edge. These edges pass various threshold values V1 to V4 or V'1 to V'4, it being assumed in the present example that the threshold value V3 is the same as the threshold value V'4.

Initially, the switches 8a and 8b are in the positions shown in FIG. 3. The comparators 6a and 6b output a low signal via the outputs 4a and 4b, respectively, when the input signal I is below the threshold value V1 or V'1, respectively. When the input signal exceeds the threshold value V1 at the instant t1, the output signal O1 on the output 4a becomes high as shown in FIG. 4b. When the input signal I passes the threshold value V2, there is no change of signal in the circuit arrangement shown in FIG. 3. It is only when the threshold value V3 is exceeded at the instant t2 that the switching device 10a switches the switch 8a to the threshold value V2 as shown in FIG. 4c. However, because the threshold value V2 is below the threshold value V3, the value of the output signal O1 does not change.

When the input signal I subsequently exceeds the threshold value V'1 at the instant t3, the output signal O2 of the comparator 6b becomes high as shown in FIG. 4d. Again there is no signal transition when the threshold value V'2 is exceeded, whereas when the threshold value V'3 is exceeded at the instant t4, the switching device 10b switches the switch 8b to the threshold value V'2. The output signal O2 of the comparator 6b does not change its value in response thereto.

When the input signal I decreases, the threshold value V'2 is passed at the instant t5 and hence the output signal O2 assumes a low value again. When the signal drops below the threshold value V'4 at the instant t6, the switching device 10b switches the switch 8b to the lower threshold value V'1 again. However, because this threshold value is higher than the input signal at the instant t6, the output signal O2 does not change.

At the instant t7 the signal drops below the threshold value V2 and hence the output signal O1 also assumes a low value again. Finally, at the instant t8 the signal drops below the threshold value V4 so that the switching device 10a switches the switch 8a to the threshold value V1 again. The initial state has thus been restored.

FIGS. 4A–4E show that the value of the output signals O1 and O2 changes at a comparatively early instant, both at the positive-going as well as at the negative-going edge of the input signal I. The threshold value V'4 is assumed to be the same as the threshold value V3 only by way of example; in reality, the threshold values V1 to V4 may have been shifted arbitrarily relative to the threshold values V'1 to V'4, since they are independent of one another. It will also be evident that the circuit shown in FIG. 3 can be extended with additional comparators and switching devices if more than three different output signals are to be generated. For the sake of simplicity of the following description of the further embodiments it is assumed that an output signal having only two different values is to be generated.

Figure 5:
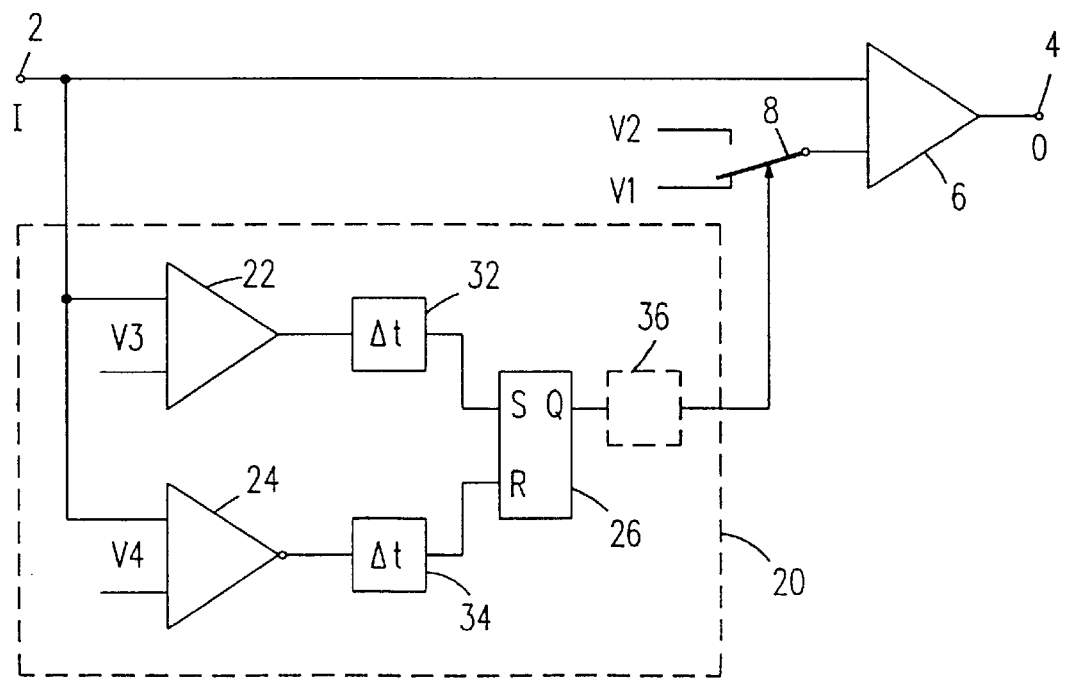
FIG. 5 shows a further embodiment of the switching arrangement for switching over the threshold values.

FIG. 5 shows a circuit arrangement which also includes a comparator 6 and a switch 8; however, the construction of the switching device 20 for the switch 8 differs from that of the circuit shown in FIG. 3. The switching device 20 includes two comparators 22 and 24, each of which includes a first input, connected to the signal input 2 for the input signal I, and a second input associated with the threshold values V3 and V4, respectively. The comparator 22 generates a high signal when the input signal I exceeds the threshold value V3, whereas the comparator 24 generates a high signal only if the input signal I is below the threshold value V4 as denoted by the circle at the output of the comparator 24. The threshold values V1 to V4 are assumed to be as shown in FIG. 4.

The output of the comparator 22 is connected to an input S of a flipflop 26 via a delay member 32, whereas the output of the comparator 24 is connected to an input R of this flipflop via a delay member 34. An output Q of the flipflop 26 controls the switch 8.

When the input signal I is below the threshold value V4 at the beginning, the flipflop 26 receives a high signal at its input R, so that its output Q outputs a low signal and the switch 8 is switched to the threshold value V1. When the input signal I subsequently exceeds the threshold value V4, the signal at the input R of the flipflop 26 becomes low, but the state thereof is retained, the output Q remains low and the position of the switch 8 remains the same. When the threshold value V1 is exceeded, the comparator 6 switches the output signal O at the signal output 4 to a high value. The state of the flipflop 26 remains the same until the input signal I exceeds the threshold value V3. At that instant the input S receives a high signal, if the effect of the delay member 32 is not taken into account for the time being, and the output Q becomes high and switches the switch 8 to the threshold value V2 so that the output signal O does not change. When the input signal I subsequently drops below the threshold value V3, the signal at the input S of the flipflop 26 becomes low again, but the state thereof is sustained until the signal drops below the threshold value V4. The comparator 24 then generates a high signal again, and the flipflop 26 switches over so that the output Q carries a low signal and the switch 8 switches back to the threshold value V1 again. When the threshold value V2 was passed, the output signal O had become low again.

The above description shows that the switching device 20 behaves exactly like the switching device 10a of FIG. 3 if the delay members 32 and 34 are ignored. These members ensure that the flipflop 26 is switched over in delayed fashion, the input voltage then already having assumed a value higher than the threshold value V3 or a value lower than the threshold value V4, respectively. Consequently, the threshold value V3 can be chosen so as to be only slightly higher than or even equal to the threshold voltage V2. Analogously, because of the presence of the delay member 34, the threshold value V4 can be chosen so as to be only slightly lower than or even equal to the threshold voltage V1. When both delay members 32 and 34 are used, they can also be replaced by a single delay member 36, denoted by dashed lines, at the output of the flipflop 26.

Figure 6:
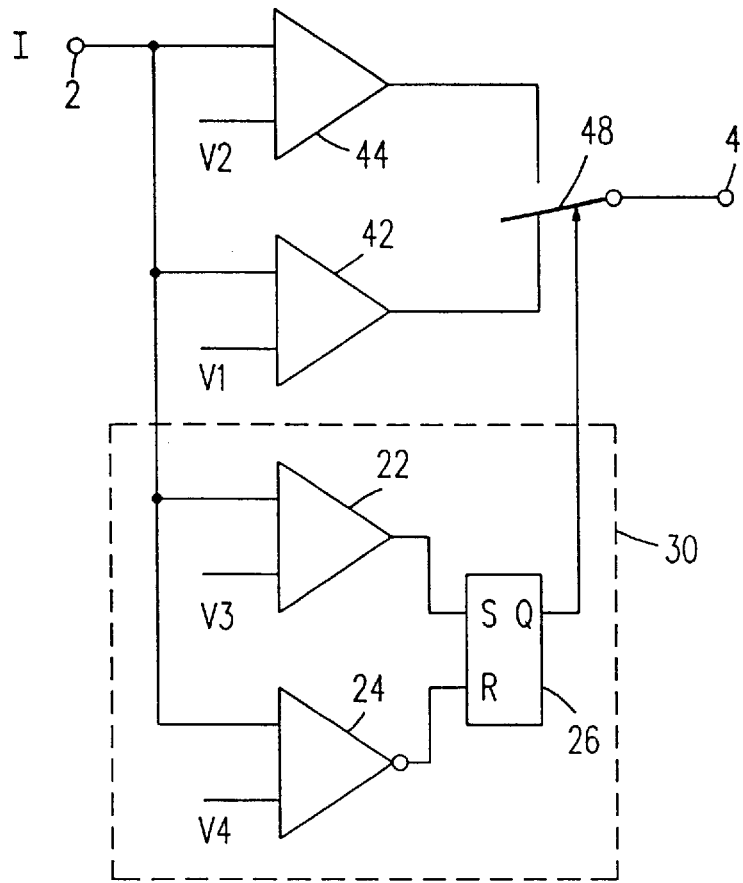
FIG. 6 shows a circuit arrangement in which the output signal is switched over.

In the embodiment shown in FIG. 6 the threshold voltage is not switched over; instead there are provided two comparators 42 and 44 which are both connected to the signal input 2, the comparator 42 comparing the input signal with the threshold voltage V1 whereas the comparator 44 compares the input signal with the threshold voltage V2. The signal output 4 of the present embodiment is connected to a switch 48 which connects the signal output to the output of the comparator 42 or of the comparator 44, depending on the switch position. The switch 48 is controlled by a switching device 30 whose construction principle is analogous to that of the switching device 20. Merely the delay members have been omitted for the sake of clarity.

The operation of the circuit shown in FIG. 6 is as follows, it being assumed that the order of the threshold values is as shown in the diagram of FIG. 4. Initially, the input signal I is smaller than the threshold value V4, so that the flipflop 26 is placed in the reset state and the signal at the output Q is low and sets the switch to the lower position shown. When the input signal I exceeds the threshold value V1, the signal at the output of the comparator 42 becomes high and hence also the output signal O at the signal output 4. When the input signal I subsequently exceeds the threshold value V2, the signal at the output of the comparator 44 also becomes high, but is not connected to signal output 4 for the time being.

When the threshold value V3 is exceeded, the flipflop 26 is switched over by the comparator 22 in the switching device 30 so that the switch 48 is set to the upper position which, however, does not change the output signal O.

When the input signal I subsequently drops below the threshold value V2, the signal at the output of the comparator 44 becomes low, and hence also the output signal O at the signal output 4. The signal at the output of the comparator 42, however, remains high for the time being and becomes low only after the input signal I has dropped below the threshold value V1. When subsequently signal also drops below the threshold value V4, the flipflop 26 is switched back to the initial state so that the switch 48 is switched to the lower position again. The output signal O does not change but remains low.

It appears from this description that the circuit of FIG. 6 generates the same output signal as the circuit of FIG. 5. The difference in construction consists in that now two comparators 42 and 44 are used in addition to the switching device 30, and that the switch is connected to the outputs of these comparators.

Figure 7:
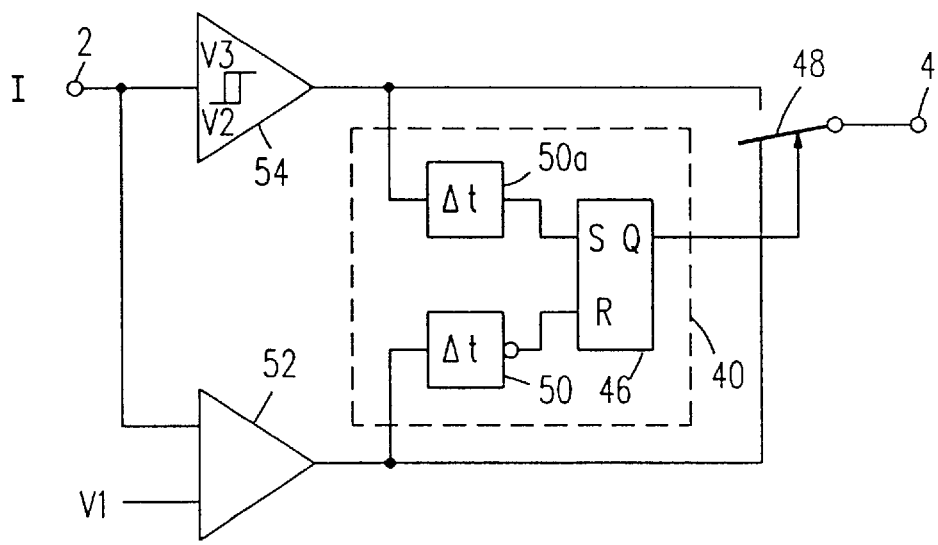
FIG. 7 shows a circuit arrangement in which the storage stage is controlled by the outputs of the comparators for the output signal.

FIG. 7 shows a substantially simplified circuit that can be derived from the embodiments described above. This circuit includes a comparator 52, one input of which is connected to the signal input 2 whereas a further input is connected to the threshold value V1. Also provided is a Schmitt trigger 54 which is also connected to the signal input 2 and has hysteresis between the threshold values V2 and V3. The output of the comparator 52 and of the Schmitt trigger 54 is connected to inputs of a switch 48 which connects one of these two elements to the signal output 4 in dependence on the switch position. The output of the comparator 52 is also connected to the input R of a flipflop 46, via a delay member 50 which in this case also has an inverting function as denoted by the circle at the output, and the output of the Schmitt trigger 54 is also coupled to the input S of the flipflop 46; this signal path may also include a delay member 50a. The output Q of the flipflop 46 controls the switch 48.

Only the flipflop 46 in the circuit shown in FIG. 7 forms a switching device 40 which controls the position of the switch 48. In comparison with the circuits shown in the FIGS. 5 and 6, the comparators 22 and 24 have been omitted because their function is taken over by the comparator 52 and the Schmitt trigger 54, respectively.

The function of the circuit shown in FIG. 7 will be described in detail hereinafter with reference to the diagram of FIG. 8. FIG. 8a again shows the variation of the input signal I and the positions of the threshold values V1, V2 and V3. The threshold value V4 used for the previously described circuits coincides with the threshold value V1 and is not separately shown. Initially the signal at the output of the comparator 52, and also of the Schmitt trigger 54, is low so that the input R of the flipflop 46 receives a high signal which switches the flipflop 46 to the reset state. The output Q carries a low signal so that the switch 48 is in the lower position shown.

When the input signal I exceeds the threshold value V1 at the instant t1, the value of the signal at the output of the comparator 52 becomes high, and hence the output signal O at the signal output 4 also becomes high as is shown in the FIGS. 8b and 8e, respectively. The Schmitt trigger 54 outputs a high signal only when the input signal I has exceeded the threshold value V3 at the instant t2 as shown in FIG. 8c. The flipflop 46 is thus switched over, that is to say immediately in the case of absence of the delay member 50 or after a corresponding delay in the case of presence of the delay member 50a as shown in FIG. 8d. The value of the output signal O at the signal output 4 does not change but remains high.

When the input signal I subsequently becomes low again and drops below the threshold value V2 at the instant t3, the signal at the output of the Schmitt trigger 54 becomes low again and hence also the output signal O, because the switch 48 is still in its upper position. When the input signal I subsequently drops below the threshold value V1 at the instant t4, the signal at the output of the comparator 52 also becomes low and the flipflop 46 is reset again after the delay introduced by the delay member 50; the switch 48 then enters its lower position again. The delay member 50 prevents small disturbances in the input signal I from having an effect, because if small interference signals are present in the input signal I at the instant t4, at which the threshold value V1 is passed, the threshold value V1 is briefly passed upwards and downwards several times, and corresponding signals then also occur at the output of the comparator 52 as indicated in FIG. 8b. If the delay member 50 were not present, the first edge of the signal at the output of the comparator 52 would switch over the flipflop 46 and connect the switch 48 to this output, so that the signal transition at the output of the comparator 52 would also appear at the signal output 4. Because of the presence of the delay member 50, however, the flipflop 46 is switched only after such short signal transitions at the output of the comparator 52 have decayed.

This illustrates that the delay member 50 can be omitted if the comparator 52 is replaced by a Schmitt trigger with hysteresis between the threshold values V1 and V4 of the order of threshold values shown in FIG. 4. On the other hand, the Schmitt trigger 54 can also be replaced by a simple comparator whose second input receives the threshold value V2 when the delay member 50a is present. However, when the comparator 52 is constructed as a Schmitt trigger, the delay members 50 and 50a can also be provided in order to enhance the reliability of the circuit arrangement additionally for both edges of the input signal.

FIG. 9 shows a circuit arrangement which corresponds to the circuit arrangement of FIG. 7 when the switch 48 and the flipflop 46 are implemented by means of separate gates. The output of the comparator 52 is connected to an input of an AND-gate 74 and, via an inverter 56 and a delay member 50, to an input of a NAND-gate 70. The output of the Schmitt trigger 54 is connected to an input of an AND-gate 76 and, via a delay member 50a, to an input of a NAND-gate 72. The outputs of the NAND-gates 70 and 72 are connected to a further input of the respective other gate and to a further input of the AND-gates 74 and 76, respectively. The outputs of the AND-gates 74 and 76 are connected to inputs of an OR-gate 78, the output of which is connected to the signal output 4. The NAND-gates 70 and 72 constitute the flipflop, whereas the gates 74, 76 and 78 constitute the switch. It will be evident that the function of the circuit shown in FIG. 9 is the same as that of the circuit shown in FIG. 7.

What is claimed is:

1. A circuit arrangement for generating at its output an output signal having a plurality of predetermined values which change over more rapidly from an input signal which varies more slowly and is applied to a signal input, when this input signal passes one of several predetermined threshold values, while utilizing at least a first switch with a switchable threshold value of its switching threshold, characterized in that:

for a low input signal, the switching threshold has a first, low predetermined threshold value, the output signal changing over from a first predetermined value to a second predetermined value when the input signal exceeds said first predetermined threshold value;

the switching threshold is switched to a second, higher predetermined threshold value when the input signal exceeds a third predetermined threshold value;

the output signal changes over to the first predetermined value again when the input signal drops below the second predetermined threshold value; and the switching threshold is switched over to the first predetermined threshold value when the input signal has dropped below a fourth predetermined threshold value.

2. A circuit arrangement as claimed in claim 1, characterized in that the third threshold value is higher than the second threshold value and/or the fourth threshold value is lower than the first threshold value.

3. A circuit arrangement as claimed in claim 1, characterized in that the third threshold value is equal to the second threshold value and that the switching over of the switching threshold from the first to the second threshold value takes place in a delayed fashion and/or the fourth threshold value is equal to the first threshold value and the switching over of the switching threshold from the second to the first threshold value takes place in a delayed fashion.

4. A circuit arrangement as claimed in claim 1, characterized in that there is provided at least a first comparator having a first input and a second input as well as an output, the output being coupled to the signal output whereas the first input is coupled to the signal input and the second input is coupled to an output of the first switch which includes two inputs which receive the first and the second threshold values and also a control input, and that for said at least first comparator there is provided a switching device having an input and an output, the input being coupled to the signal input and the output to the control input of the first switch, the first switch being switched over from the first threshold value to the second threshold value when the input signal exceeds the third threshold value whereas the first switch is switched over from the second threshold value to the first threshold value when the input signal drops below the fourth threshold value.

5. A circuit arrangement as claimed in claim 1, characterized in that there are provided at least first and second comparators, each of which includes at least a first input and an output, the first inputs of said at least first and second comparators being connected to the signal input, the signal at the output of the first comparator changing when the first threshold value is passed whereas the signal at the output of the second comparator changes when the second threshold value is passed, the outputs of both comparators being connected to inputs of the first switch which has an output which is connected to the signal output and includes a control input, and that for both of the first and second comparators, there is provided a single switching device having an input and an output, the input being coupled to the signal input and the output to the control input of the first switch, the switching device switching the second switch from the output of the first comparator to the output of the second comparator, wherein the first switch couples this output to the signal output when the input signal exceeds the third threshold value, and switching the first switch from the output of the second comparator to the output of the first comparator, wherein the first switch couples this output to the signal output when the input signal drops below the fourth threshold value.

6. A circuit arrangement as claimed in claim 4, characterized in that the switching device includes a Schmitt trigger with an input and an output and a switching hysteresis with switching voltages corresponding to the third threshold value and the fourth threshold value, its input being coupled to the signal input and its output to the control input of the first switch.

7. A circuit arrangement as claimed in claim 5, characterized in that the switching device includes a bistable storage stage, having a first and a second input and an output, as well as first and second further comparators, each of which comprises a first input, a second input and an output, the output of the storage stage being coupled to the control input of the first switch, the two inputs of the storage stage being connected to the output of the respective corresponding further comparator, the first input of both further comparators being connected to the signal input whereas the second input of both further comparators receive the third threshold value and the fourth threshold value, respectively.

8. A circuit arrangement as claimed in claim 5, characterized in that the switching device includes a bistable storage stage with a first input, a second input and an output, the output being connected to the control input of the first switch whereas the first input is coupled to the output of the first comparator and the second input is coupled to the output of the second comparator.

9. A circuit arrangement as claimed in claim 8, characterized in that each of the first and second comparators is constructed as a Schmitt trigger with a switching hysteresis with switching voltages corresponding to the first threshold value and the fourth threshold value for the first comparator and corresponding to the second threshold value and the third threshold value for the second comparator.

10. A circuit arrangement as claimed in claim 7, characterized in that at least one of the inputs of the bistable storage stage is preceded by a delay stage.

11. A circuit arrangement as claimed in claim 5, characterized in that the switching device includes a Schmitt trigger with an input and an output and a switching hysteresis with switching voltages corresponding to the third threshold value and the fourth threshold value, its input being coupled to the signal input and its output to the control input of the first switch.

12. A circuit arrangement as claimed in claim 5, characterized in that the switching device includes a bistable storage stage, having a first input, a second input and an output, as well as first and second further comparators, each of which comprises a first input, a second input and an output, the output of the bistable storage stage being coupled to the control input of the first switch, the two inputs of the bistable storage stage being connected to the output of the respective corresponding further comparator, the first input of both further comparators being connected to the signal input whereas the second input of said further comparators receive the third threshold value and the fourth threshold value, respectively.

13. A circuit arrangement as claimed in claim 8, characterized in that at least one of the inputs of the bistable storage stage is preceded by a delay stage.

14. A circuit arrangement as claimed in claim 12, characterized in that at least one of the inputs of the bistable storage stage is preceded by a delay stage.

* * * * *